(12) United States Patent
Allen et al.

(10) Patent No.: US 8,223,031 B1
(45) Date of Patent: Jul. 17, 2012

(54) GROUND POTENTIAL RISE MONITOR

(75) Inventors: Zachery Warren Allen, Mandan, ND (US); Gary Allen Zevenbergen, Arvada, CO (US)

(73) Assignee: The United States of America as represented by the Department of Energy, Washington, DC (US)

( * ) Notice: Subject to any disclaimer, the term of this patent is extended or adjusted under 35 U.S.C. 154(b) by 0 days.

(21) Appl. No.: 13/191,725

(22) Filed: Jul. 27, 2011

Related U.S. Application Data

(63) Continuation-in-part of application No. 12/401,033, filed on Mar. 10, 2009, now Pat. No. 8,149,128, and a continuation-in-part of application No. PCT/US2010/026189, filed on Mar. 4, 2010.

(51) Int. Cl.
*G08B 21/00* (2006.01)
(52) U.S. Cl. .................. 340/662; 340/657; 340/660
(58) Field of Classification Search .................. None
See application file for complete search history.

(56) References Cited

U.S. PATENT DOCUMENTS

| | | | | |
|---|---|---|---|---|
| 3,548,332 A | * | 12/1970 | Omura et al. | 330/284 |
| 4,897,606 A | * | 1/1990 | Cook et al. | 324/509 |
| 5,933,011 A | * | 8/1999 | Atkins | 324/509 |
| 6,265,881 B1 | * | 7/2001 | Meliopoulos et al. | 324/691 |
| 7,323,878 B2 | * | 1/2008 | Gaston et al. | 324/510 |

OTHER PUBLICATIONS

Dynamic Step and Touch Instrument Manual Aug. 15, 2003 Version 0.5 from Delta Computer Systems, Inc. 11719 NE 95th Street, Suite D Vancouver, WA 98682-2444.

* cited by examiner

*Primary Examiner* — Travis Hunnings
(74) *Attorney, Agent, or Firm* — Michael J. Dobbs; Daniel D. Park; John T. Lucas

(57) ABSTRACT

A device and method for detecting ground potential rise (GPR) comprising a first electrode, a second electrode, and a voltage attenuator. The first electrode and the second electrode are both electrically connected to the voltage attenuator. A means for determining the presence of a dangerous ground potential is connected to the voltage attenuator. The device and method further comprises a means for enabling one or more alarms upon the detection of the dangerous ground potential. Preferably, a first transmitter/receiver is connected to the means for enabling one or more alarms. Preferably, a second transmitter/receiver, comprising a button, is electromagnetically connected to the first transmitter/receiver. Preferably, the means for determining the presence of a dangerous ground potential comprises a means for determining the true RMS voltage at the output of the voltage attenuator, a transient detector connected to the output of the voltage attenuator, or a combination thereof.

11 Claims, 12 Drawing Sheets

GROUND POTENTIAL RISE MONITOR

CROSS REFERENCE TO RELATED APPLICATIONS

This application is a continuation-in-part of prior application U.S. non-provisional patent application Ser. No. 12/401,033, filed Mar. 10, 2009 now U.S. Pat. No. 8,149,128, hereby fully incorporated by reference. This application is also a continuation-in-part of prior PCT application PCT/US10/26189, filed Mar. 4, 2010, hereby fully incorporated by reference.

GOVERNMENT INTERESTS

The United States Government has rights in this invention pursuant to the employer-employee relationship between the inventors and the U.S. Department of Energy (DOE).

FIELD OF THE INVENTION

A device and method for detecting ground potential rise, preferably for the detection and notification of a rise in ground potential.

BACKGROUND OF THE INVENTION

As new demands are placed on the electric power system, more transmission lines are built and/or upgraded in existing right-of-ways, and fewer maintenance outages are accommodated, maintenance personnel are encountering new challenges in their work. One of these challenges pertains to Ground Potential Rise (GPR).

During the repair of a transmission line, personal protective ground cables are installed to safely transfer electric current away from workers in the area into the earth through a work site ground system. This electric current may be generated by various means, such as, electromagnetic induction from a nearby current carrying line. Unfortunately, the earth is not an ideal conductor and as more current passes into the ground, the ground potential of the earth at and around the work site ground increases. As this ground potential changes, workers may be exposed to dangerous voltages.

Currently the only method of safely minimizing GPR is the use of a plurality of grounding cables carrying current into the earth at multiple points. Unfortunately, this does not solve the problem of GPR, but only lowers peak voltages at the cost of spreading the voltage across a larger area. This not only fails to eliminate GPR or notify users of a GPR issue, but may spread GPR to an area considered away from the worksite.

Therefore, there exists a need to safely detect the presence of GPR. Once GPR is detected, specialized equipment (e.g. highly insulated boots, gloves, etc. . . . ) may be used by workers to perform their work safely.

SUMMARY OF THE INVENTION

A device and method for detecting ground potential rise (GPR) comprising a first electrode, a second electrode, and a voltage attenuator. The voltage attenuator comprising a first input, a second input, and an output. The first electrode is electrically connected to the first input of the voltage attenuator. The second electrode is electrically connected to the second input of the voltage attenuator. A means for determining the presence of a dangerous ground potential is connected to the voltage attenuator. Preferably, the means for determining the presence of a dangerous ground potential comprises a means for determining the true RMS voltage at the output of the voltage attenuator, a transient detector connected to the output of the voltage attenuator, or a combination thereof. The device and method for detecting ground potential rise (GPR) also comprises a means for enabling one or more alarms upon the detection of the dangerous ground potential. The means for determining the presence of a dangerous ground potential and the means for enabling one or more alarms comprises one or more computers, microcontrollers, or application specific integrated circuits (ASIC).

Preferably, a first transmitter/receiver is connected to the means for enabling one or more alarms. A second transmitter/receiver is electromagnetically connected to the first transmitter/receiver. A button connected to the second transmitter/receiver.

Preferably, the means for determining the presence of a dangerous ground potential comprises a means for determining the true RMS voltage at the output of the voltage attenuator. In this embodiment, the means for enabling one or more alarms preferably comprises a means for enabling one or more alarms when the true RMS voltage exceeds a first predetermined voltage threshold.

Preferably, the means for determining the presence of a dangerous ground potential comprises a transient event energy detector connected to the output of the voltage attenuator. In this embodiment, preferably, the transient event energy detector has a means for sampling the voltage at the output of the voltage attenuator at a low-speed and at a high-speed; the high-speed greater than the low-speed. Preferably, the high-speed is equal to or greater than 1,000 Hz, more preferably equal to or greater than 2,000 Hz. Preferably, the low-speed is equal to or less than 10 Hz, more preferably 6 Hz. In this embodiment, preferably, the means for enabling one or more alarms comprises a means for enabling one or more alarms when the transient event energy detected by the transient event energy detector exceeds a first predetermined transient event energy threshold. Preferably, the first predetermined transient event energy threshold is in Joules or related to Joules, more preferably greater than 13 Joules.

DETAILED DESCRIPTION OF THE INVENTION

Figure 1:
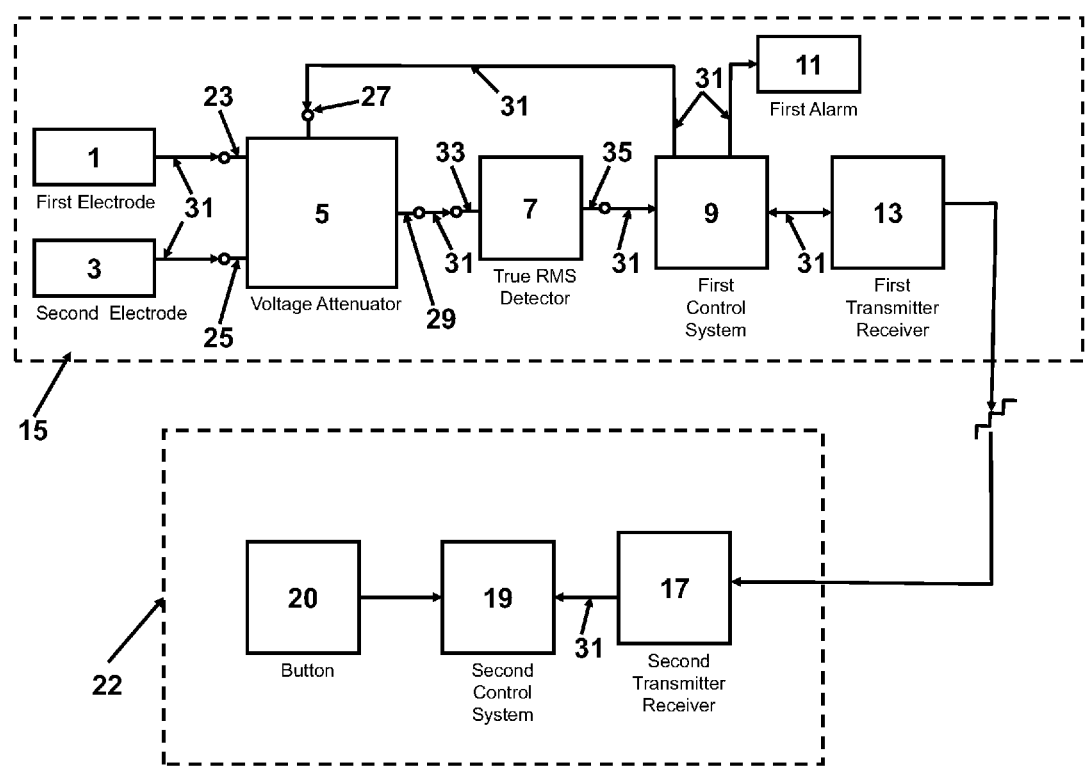
FIG. 1 depicts one embodiment of a Ground Potential Rise (GPR) Monitor System using a true RMS voltage.

A device and method for detecting ground potential rise (GPR) comprising a first electrode, a second electrode, and a voltage attenuator. The voltage attenuator comprising a first input, a second input, and an output. The first electrode is electrically connected to the first input of the voltage attenuator. The second electrode is electrically connected to the second input of the voltage attenuator. A means for determining the presence of a dangerous ground potential is connected to the voltage attenuator. Preferably, the means for determining the presence of a dangerous ground potential comprises a means for determining the true RMS voltage at the output of the voltage attenuator, a transient detector connected to the output of the voltage attenuator, or a combination thereof. The device and method for detecting ground potential rise (GPR) also comprises a means for enabling one or more alarms upon the detection of the dangerous ground potential. The means for determining the presence of a dangerous ground potential and the means for enabling one or more alarms comprises one or more computers, microcontrollers, or application specific integrated circuits (ASIC).

Preferably, a first transmitter/receiver is connected to the means for enabling one or more alarms. A second transmitter/receiver is electromagnetically connected to the first transmitter/receiver. A button connected to the second transmitter/receiver.

Preferably, the means for determining the presence of a dangerous ground potential comprises a means for determining the true RMS voltage at the output of the voltage attenuator. In this embodiment, the means for enabling one or more alarms preferably comprises a means for enabling one or more alarms when the true RMS voltage exceeds a first predetermined voltage threshold.

Preferably, the means for determining the presence of a dangerous ground potential comprises a transient event energy detector connected to the output of the voltage attenuator. In this embodiment, preferably, the transient event energy detector has a means for sampling the voltage at the output of the voltage attenuator at a low-speed and at a high-speed; the high-speed greater than the low-speed. Preferably, the high-speed is equal to or greater than 1,000 Hz, more preferably equal to or greater than 2,000 Hz. Preferably, the low-speed is equal to or less than 10 Hz, more preferably 6 Hz. In this embodiment, preferably, the means for enabling one or more alarms comprises a means for enabling one or more alarms when the transient event energy detected by the transient event energy detector exceeds a first predetermined transient event energy threshold. Preferably, the first predetermined transient event energy threshold is in Joules or related to Joules, more preferably greater than 13 Joules.

In one embodiment, a device and method for detecting ground potential rise (GPR) comprising attenuating, by an attenuation factor, the voltage between a first electrode electrically connected to earth and a second electrode electrically connected to earth at a distance from the first electrode. Preferably, the true RMS voltage of the attenuated voltage is determined producing an attenuated true RMS voltage. The attenuated true RMS voltage is then multiplied by the attenuation factor producing a calculated true RMS voltage. If the calculated true RMS voltage exceeds a first predetermined voltage threshold, a first alarm at a local location is enabled. If user input is received at a remote location acknowledging the first alarm, a first alarm acknowledgment signal is transmitted. The first alarm acknowledgment signal is then received at which time the first alarm is disabled.

One embodiment of a GPR monitor system comprises a first electrode, a second electrode, a voltage attenuator, a true RMS detector, a first control system, a first alarm, a first transmitter/receiver, a second transmitter/receiver, a second control system and a button. The first electrode and the second electrode are positioned in the earth at a distance from each other. The voltage attenuator has a first input, a second input, a selection port, and an output. The true RMS detector has an input and an output. The first transmitter/receiver and the first alarm are positioned at a local location. The second transmitter/receiver and the button are located at a remote location.

The first electrode is electrically connected to the first input of the voltage attenuator. Likewise, the second electrode is electrically connected to the second input of the voltage attenuator. The output of the voltage attenuator is connected to the input of the true RMS voltage detector. The first control system is connected to the output of the true RMS detector, the first alarm, the selection port of the voltage attenuator, and the first transmitter/receiver. The first transmitter/receiver is electromagnetically connected to the second transmitter/receiver. Preferably, the second control system is connected to the second transmitter/receiver and a button.

Preferably, the voltage attenuator attenuates the voltage between the first electrode and the second electrode by dividing the voltage between the first electrode and the second electrode by an attenuation factor creating an attenuated voltage. The attenuation factor used by the voltage attenuator is preferably controlled by the selection port of the voltage attenuator. The true RMS voltage detector then produces an attenuated true RMS voltage from the attenuated voltage. Preferably, the first control system then calculates the true RMS voltage from the attenuated RMS voltage and the attenuation factor by multiplying the attenuated true RMS voltage by the attenuation factor. If the calculated true RMS voltage is greater than a first predetermined voltage threshold, the first alarm is enabled.

Preferably, a user can then use the button at the remote location to acknowledge the first alarm, at which time the second transmitter/receiver transmits a first alarm acknowledge signal. The first alarm acknowledge signal is then received by the first transmitter/receiver and the control system disables the first alarm.

FIG. 1

FIG. 1 depicts one embodiment of a GPR monitor system having a first electrode 1, a second electrode 3, a voltage attenuator 5, a true RMS detector 7, a first control system 9, a first alarm 11, and a first transmitter/receiver 13 at a local location 15. The embodiment shown in FIG. 1 also has a second transmitter/receiver 17, a second control system 19, and a button 20 at a remote location 22, preferably in the form of a portable device. It is preferred to include the first transmitter/receiver 13 and second transmitter/receiver 17, second control system 19, and button 20, as the remote location 22 provides as a safe place for workers to acknowledge the alarm. In the alternative, the first transmitter/receiver 13 and second transmitter/receiver 17, second control system 19, and button 20 may be omitted, preferably relying on other safety measures (e.g. electrically insulated boots, gloves, etc.).

The voltage attenuator 5 has a first input 23, a second input 25, a selection port 27, and output 29. The first electrode 1 is electrically connected to the first input 23 of the voltage attenuator 5 by one or more wires 31. The second electrode 3 is electrically connected to the second input 25 of the voltage attenuator 5 by one or more wires 31.

The true RMS detector 7 has an input 33 and an output 35. The input 33 of the true RMS detector 7 is connected to the output 29 of the voltage attenuator 5 by one or more wires 31. The first control system 9 is connected to the output 35 of the true RMS detector 7, the selection port 27 of the voltage attenuator 5, the first alarm 11, and the first transmitter/receiver 13 by one or more wires 31.

The first transmitter/receiver 13 is electromagnetically connected to the second transmitter/receiver 17. The second control system 19 is connected to the second transmitter/receiver 17 and the button 20 by one or more wires 31.

The First Electrode 1 and the Second Electrode 3

The first electrode 1 is preferably positioned at an area of the local location 15 most susceptible to GPR, e.g. grounding lines carrying current away from workers. The first electrode 1 is any electrically conductive connection to ground susceptible to GPR. In a preferred embodiment, the first electrode 1 is electrically connected to a grounding rod, guy wires, power lines supports, or any other grounding means for grounding one or more power sources. In a preferred embodiment, the first electrode 1 is electrically connected to a grounding rod used to ground one or more power sources. In another embodiment, the first electrode 1 is an electrically conductive connection traveling through various components (e.g. pipes, tubes, various building materials, etc. . . . ) to the ground.

The second electrode 3 is positioned at a distance away from the first electrode 1. The second electrode 3 is any electrically conductive connection to the ground. Preferably, the second electrode 3 is positioned away from the first electrode 1 and in an area of the local location 15 least susceptible to GPR. In one preferred embodiment, the second electrode 3 is a conductive metal positioned in the earth at least ten feet away from the first electrode 1 or any other grounding means. In another embodiment, the second electrode 3 is an electrically conductive connection traveling through various components (e.g. pipes, tubes, various building materials, etc. . . . ) to the ground.

The Voltage Attenuator 5

The voltage attenuator 5 has a first input 23 a second input 25, a selection port 27, and output 29. The first input 23 is electrically connected to the first electrode 1 by one or more wires 31. The second input 25 is electrically connected to the second electrode 3 by one or more wires 31. The selection port 27 is connected to the first control system 9 by one or more wires 31. The output 29 of the voltage attenuator 5 is connected to the input 33 of the true RMS detector 7.

The voltage attenuator 5 attenuates the voltage between the first input 23 (electrically connected to first electrode 1) and the second input 25 (electrically connected to the second electrode 3) and produces an attenuated voltage at its output 29. The attenuated voltage can then be used by low voltage (5 volts and under) digital logic electronics such as computers, microcontrollers, application specific integrated circuits (ASIC) etc. In one embodiment, the voltage attenuator 5 produces a first and second output, whereby the voltage between the first and second output is the attenuated voltage. In an alternate embodiment, the voltage attenuator 5 produces a single output, whereby the voltage between the single output and a common ground is the attenuated voltage.

The voltage attenuator 5 produces an attenuated voltage corresponding to the voltage at the first electrode 1 and the second electrode 3 divided by an attenuation factor. As the true RMS detector 7 will have the highest resolution with the least amount of attenuation by the voltage attenuator 5, but also have a maximum operating input voltage, the output 29 of the voltage attenuator 5 preferably produces the highest operating voltage (having the least attenuation) that can be used by the true RMS detector 7, especially without damaging the true RMS detector 7.

Preferably, the selection port 27 is an input port whereby the voltage attenuator 5 attenuates the voltage between the first electrode 1 and the second electrode 3 at the direction of the first control system 9 through the selection port 27. In the alternative, the selection port 27 may be an output port whereby the voltage attenuator 5, or alternately a third control system, produces the attenuation factor, which can be used by the first control system 9 to determine the calculated true RMS voltage.

Preferably, the voltage attenuator 5 uses a voltage divider to selectively attenuate the voltage potential between its first input 23 (electrically connected to first electrode 1) and its second input 25 (electrically connected to the second electrode 3). In the alternative, the voltage attenuator 5 is an operational amplifier, transistor based circuit (e.g. transistor selected voltage dividers), or any other means to attenuate a voltage. In a preferred embodiment, the voltage attenuator 5 is the voltage attenuator 5 depicted in FIG. 5.

Preferably, the voltage attenuator 5 produces between the maximum voltage and the minimum voltage that can be detected by the true RMS detector 7. In a preferred embodiment, the voltage attenuator 5, the true RMS detector 7 or a combination thereof has a voltage limiting means whereby the output 29 of the voltage attenuator 5 has an output voltage between the maximum voltage and the minimum voltage of the true RMS detector 7.

In one embodiment, a first diode and a second diode are used to limit the voltages of the output 29 of the voltage attenuator 5 between the maximum voltage and the minimum voltage of the true RMS detector 7. In this embodiment, the first diode is connected in reverse polarity to the output 29 of the voltage attenuator 5 and a voltage source producing the maximum voltage of the true RMS detector 7. Likewise, the second diode is connected in reverse polarity to the output 29 of the voltage attenuator 5 and a voltage source producing the minimum voltage of the true RMS detector 7. Therefore preventing the output 29 of the voltage attenuator 5 from exceeding the maximum voltage and the minimum voltage of the true RMS detector 7.

Preferably the output 29 of the voltage attenuator 5 is an analog output. In the alternative, the voltage attenuator 5 produces a digital signal to the true RMS detector 7 via a plurality of parallel connections, a serial data bus, or other digital connection means.

The True RMS Detector 7

The true RMS detector 7 has input 33 and an output 35. The input 33 of the true RMS detector 7 is connected to the output 29 of the voltage attenuator 5, preferably by one or more wires 31. The true RMS detector 7 determines the true RMS voltage of its input 33. The true RMS detector 7 produces an attenuated true RMS voltage, the calculated true RMS voltage between the first electrode 1 and the second electrode 3 attenuated by the attenuation factor of the voltage attenuator 5. The true RMS voltage is the square-root of the average of the square of the voltage of the input 33. In one embodiment, the voltage of the input 33 is squared at a predetermined time interval, averaged for the predetermined time interval, and square rooted.

The true RMS voltage is preferably calculated without the use of approximations, as the GPR may be generated from various sources having various waveforms from one or more combined DC or AC signals having various waveforms. Furthermore, unknown ground conditions at the first electrode 1 and the second electrode 3 or other circuitry in the system may also act as a filter filtering some frequencies or DC voltages while allowing others to pass.

In the alternative, the voltage of the input 33 is digitally captured and stored (e.g. by the first control system 9 or buffer) and after a select time interval the true RMS is calculated by the square-root of the average of the square of the voltage between the stored voltages. Other means of determining the true RMS voltage may be used. In a preferred embodiment, the true RMS voltage is determined by a computer, microcontroller, or an application specific integrated circuit (ASIC). More preferably, the true RMS voltage is determined by an ASIC such as the AD736 True RMS-to-DC converter.

In the embodiment shown in FIG. 1, the true RMS detector 7 determines the true RMS voltage of the attenuated voltage produced at the output 29 of the voltage attenuator 5. Preferably, the input 33 of the true RMS detector is a first input having a corresponding second input, whereby the voltage between the first input and the second input is the attenuated true RMS voltage. In an alternate embodiment, the input 33 is a single input, whereby the voltage between the single input and a common ground is the attenuated true RMS voltage.

The attenuated true RMS voltage is then produced at the output 35 of the true RMS detector 7. Preferably, the output 35 of the true RMS detector 7 is a single output and the true RMS detector 7 shares a common ground with the first control system 9. In the alternative, the output 35 of the true RMS detector 7 may be a first output having a corresponding second output, whereby both the first output and the second output are connected to the first control system 9 and the voltage between the first output and the second output is the true RMS voltage.

Preferably the output 35 of the true RMS detector 7 is an analog output, and the first control system 9 has an analog-to-digital converter for reading the voltage outputted by the true RMS detector 7. For simplicity, the output 35 of the true RMS detector 7 is treated as producing an attenuated true RMS voltage. However, the true RMS detector 7 will preferably produce a signal symbolic of the attenuated true RMS voltage. For example, the preferred AD736 True RMS-to-DC converter produces an analog dc voltage which can be multiplied by a known multiplication factor (preferably by the first control system 9) to determine the attenuated true RMS voltage.

In the alternative, the true RMS detector 7 produces a digital signal to the first control system 9 via a plurality of parallel connections, a serial data bus, or other digital connection means. Preferably, in this embodiment the digital signal corresponds to the actual attenuated true RMS voltage. However, in other embodiments, the digital signal may need to be multiplied by some factor or other calculations may be necessary for the actual attenuated true RMS voltage to be calculated (preferably by the first control system 9).

The First Alarm 11

The first alarm 11 is enabled at the local location 15 notifying the workers at the local location 15 of potentially unsafe GPR. The first alarm 11 is preferably connected to the first control system 9 via one or more wires 31. The first alarm 11 is enabled when the calculated true RMS voltage is greater than a first predetermined voltage threshold. Preferably, the first alarm 11 is a device capable of creating an audible signal, visible signal, vibration or a combination thereof. In a preferred embodiment, the first alarm 11 is a horn.

The First Control System 9

The first control system 9 is electrically connected to the selection port 27 of the voltage attenuator 5, the output 35 of the true RMS detector 7, the first alarm 11, and the first transmitter/receiver 13, preferably by one or more wires 31. Any means of connecting the first control system 9 to the various components may be used (e.g. electrical, optical, electromagnetic, etc. . . . ). The first control system 9 preferably calculates the true RMS voltage between the first electrode 1 and the second electrode 3 by multiplying the output 35 of the true RMS detector 7 by the attenuation factor used by the voltage attenuator 5. The first control system 9 also performs any conversions necessary to enable the first alarm 11 if the calculated true RMS voltage reading is greater than the first predetermined voltage threshold.

The first control system 9 preferably controls the voltage attenuator 5 to properly attenuate the voltage of the first electrode 1 and the second electrode 3. In one alternate embodiment, the first control system 9 receives the attenuation factor from the selection port 27 of the voltage attenuator 5. In yet another alternate embodiment, the first control system 9 receives the attenuation factor from another source, such as a third control system controlling or receiving the attenuation factor from the voltage attenuator 5.

The control system 9 has the necessary digital-to-analog, analog-to-digital, power relays, electrical switches, etc. . . . necessary to receive, read, control power, or various combinations thereof the various components connected to the control system 9. For example, if the output 35 of the true RMS detector 7 is analog, the first control system 9 preferably has an analog-to-digital converter used to convert the voltage produced at the output 35 of the true RMS detector 7 (attenuated true RMS voltage) to a digital value used by the control system 9. Likewise, the first control system 9 preferably has a digital connection (e.g. data bus, serial connection, parallel connection) for sending the calculated true RMS voltage to the first transmitter/receiver 13. In one alternate embodiment, the first control system 9 has a digital-to-analog converter for sending a calculated true RMS voltage to the first transmitter/receiver 13. Similarly, the control system 9 preferably uses an electrical switch (relay, transistor, etc. . . . ) to power, therefore enabling, the first alarm 11 or disable the first alarm 11.

Various aspects of the first control system 9 may be implemented using various computers, microcontrollers, application specific integrated circuits (ASICs) or others means. In a preferred embodiment, the first control system 9 is an Atmel ATMEGA32.

Any number of the voltage attenuator 5, the true RMS detector 7, the first control system 9 and the first transmitter/receiver 13 may be combined. For example, in one embodiment, the first control system 9 is a microcontroller capable of determining the attenuated true RMS voltage directly from the voltage attenuator, thus serving as both the true RMS detector 7 as well as the first control system 9. Likewise, in another embodiment, the first control system 9 has a means for transmitting/receiving thus serving as both the first transmitter/receiver 13 as well as the first control system 9.

In one embodiment, the first control system 9 has a means for logging data comprising RMS voltage readings, preferably with time and date stamps. Preferably, the time and date stamps are generated using a real time clock (RTC) powered by an independent user replaceable battery backup, whereby the user may remove or completely discharge a main battery without affecting the clock. Preferably, the logged data is stored on a removable media, for example but not limited to: SD card, memory stick, or other magnetic media storage or flash memory based device. Additionally, preferably, the logging data further comprises transient event energies. In yet another embodiment, the logging data further comprises the status of various alarms in the system (e.g. first alarm 11). Preferably, the logged data is stored in an industry standard format, for example ASCII. Preferably, the logged data is stored in a file on a predetermined filesystem (e.g. FAT, NTFS, EXT3, EXT4, ZFS, etc) and a more preferably, a new file is created each time the device is powered-on. Preferably, if the logged data has filled or will fill the media storage, files are deleted with the oldest data first. Preferably, if a storage media is not present, the control system 9 sends a signal to display a warning to the user, for example an icon indicative that logging has been disabled.

First Transmitter/Receiver 13

The first transmitter/receiver 13 is connected to the first control system 9 and electromagnetically connected to the second transmitter/receiver 17. When the first predetermined voltage threshold is exceeded by the calculated true RMS voltage, the first alarm 11 is enabled by the first control system 9 until a first alarm acknowledgment signal is transmitted by the second transmitter/receiver 17 and received by the first transmitter/receiver 13.

Preferably, the signal corresponding to the calculated true RMS voltage is transmitted by the first transmitter/receiver 13 and received by the second transmitter and receiver 17, more preferably using a protocol such as defined in IEEE 802.15.4. In a preferred embodiment, the first transmitter/receiver 13 and the second transmitter/receiver 17 are both an Xbee® transmitter. Preferably, the true RMS voltage is then displayed to a user at the remote location 22.

The Local Location 15

The local location 15 is preferably a worksite. More preferably, the local location 15 is a worksite where significant amounts of electrical current are transferred into the earth. The first alarm 11 is enabled at the local location 15 preferably to notify the workers at the local location 15 of potentially unsafe GPR at the local location 15. Preferably, the voltage attenuator 5, true RMS detector 7, first control system 9, first alarm 11, and first transmitter/receiver 13 are all encased within a portable casing.

The Second Transmitter/Receiver 17

The second transmitter/receiver 17 is connected to the second control system 19 and electromagnetically connected to the first transmitter/receiver 13. In a preferred embodiment, the second transmitter/receiver 17 is an Xbee® receiver. When the calculated true RMS voltage exceeds the first predetermined voltage threshold, the first alarm 11 is enabled until a first alarm acknowledgment signal is transmitted by the second transmitter/receiver 17 and received by the first transmitter/receiver 13.

In a preferred embodiment, the second transmitter/receiver 17 is an existing handheld device or an attachment for an existing device. Preferably, the existing device is a smartphone, table, notebook, netbook, or other portable device. In one embodiment, the second transmitter/receiver 17 is provided by an existing device or an attachment for an existing device. Preferably, the existing device is a device using iPhone OS or iOS (e.g. iPad, iPod, iPhone) as created by Apple Inc., a device using the Android operating system as created by Google (e.g. Google Nexus One, Nexus S, HTC G2, etc.), a device using the Windows Mobile or Windows Phone 7 operating system as created by Microsoft (e.g. HD2, H7).

The Button 20

The button 20 is any means for the user to acknowledge the first alarm 11. In one embodiment, this button 20 is a simple push button used to trigger the second control system 19, the second transmitter/receiver 17, or a combination thereof to construct and transmit a first alarm acknowledgement signal which is received and understood by the first control system 9, the first transmitter/receiver 13, or a combination thereof. In an alternate embodiment, the button 20 is a plurality of keys, for example forming a keyboard or other user interface. In yet another alternate embodiment, the button 20 is a touch sensitive portion or layer of a screen, thereby allowing the user to simply touch the screen to acknowledge the first alarm 11.

The Second Control System 19

The second control system 19 is connected to the second transmitter/receiver 17, and the button 20, preferably by the one or more wires 31. The second control system 19 with the second transmitter/receiver 17 constructs and transmits an acknowledgment signal to the first transmitter/receiver 13 to acknowledge an alarm sounded by the first control system 9.

Various aspects of the second control system 19 may be implemented using various computers, microcontrollers, application specific integrated circuits (ASICs) or others means. In a preferred embodiment, the first control system 9 is an Atmel ATMEGA32.

In a preferred embodiment, the second control system 9 is provided by an existing device or an attachment for an existing device. Preferably, the existing device is a device using iPhone OS or iOS (e.g. iPad, iPod, iPhone) as created by Apple Inc., a device using the Android operating system as created by Google (e.g. Google Nexus One, Nexus S, HTC G2, etc.), a device using the Windows Mobile or Windows Phone 7 operating system as created by Microsoft (e.g. HD2, H7).

Preferably, the first predetermined voltage threshold, the threshold at which the first alarm 11 is enabled, is programmable at the remote location 22. In one embodiment, the second control system 19 has a plurality of buttons, switches, or other control means to allow the user to select or enter-in the first predetermined true RMS voltage.

The second control system 19 and the second transmitter/receiver 17 may be combined. For example, in one embodiment, the second control system 19 has a means for transmitting/receiving thus serving as both the second transmitter/receiver 17 as well as the second control system 19.

The Remote Location 22

The remote location 22 is preferably at a safe distance away from the local location 15. More preferably, the remote location 22 is at least ten feet away from the local location 15. Preferably, when the first alarm 11 is enabled, it produces an alarm significant enough to notify the workers at the remote location 22 of potentially unsafe GPR at the local location 15. The second transmitter/receiver 17, second control system 19, and second alarm 21 are all located at the remote location 22, preferably in a compact case.

The One or More Wires 31

The one or more wires 31 are any means to electrically connect the various components together. Preferably, the wires are one or more electrical conductors. In the alternative any means of connecting the various components may be used (e.g. electrical, optical, electromagnetic, etc. . . . ).

FIG. 2

Figure 2:
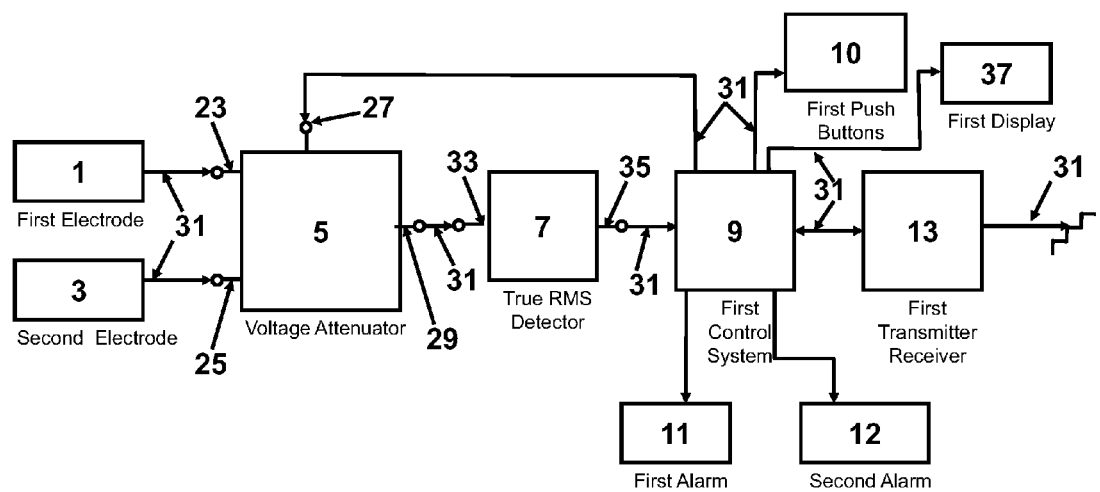
FIG. 2 depicts a preferred embodiment of a Ground Potential Rise (GPR) Monitor Sensor using a true RMS voltage.

FIG. 2 depicts a preferred embodiment of a GPR monitor sensor having a first electrode 1, a second electrode 3, a voltage attenuator 5, a true RMS detector 7, a first control system 9, a first alarm 11, a second alarm 12, a first display 37, first push buttons 10, and a first transmitter/receiver 13 at a local location.

The voltage attenuator 5 has a first input 23, a second input 25, a selection port 27, and output 29. The first electrode 1 is electrically connected to the first input 23 of the voltage attenuator 5 by one or more wires 31. The second electrode 3 is electrically connected to the second input 25 of the voltage attenuator 5 by one or more wires 31. The true RMS detector 7 has input 33 and an output 35. The output 29 of the voltage attenuator 5 is connected to the input 33 of the true RMS detector 7 by one or more wires 31. The first control system 9 is connected to the output 35 of the true RMS detector 7, the selection port 27 of the voltage attenuator 5, the first alarm 11, the second alarm 12, the first display 37, the first push buttons 10, and the first transmitter/receiver 13 by one or more wires 31.

The first control system 9 continuously calculates the true RMS voltage between the first electrode 1 and the second electrode 3 (by multiplying the attenuated true RMS voltage from the true RMS detector 7 by the attenuation factor of the voltage attenuator 5). If the calculated true RMS voltage exceeds a first predetermined voltage threshold, the first alarm 11 is enabled, preferably producing a visual alarm until an acknowledgment is received. Likewise, if the calculated true RMS voltage exceeds a second predetermined voltage threshold, the second alarm 12 is enabled, preferably producing an audible alarm until an acknowledgment is received. Preferably, both the first alarm 11 and the second alarm 12 are each capable of being acknowledged by the first push buttons 10, a signal from a remote handheld unit (e.g. the embodiment shown in FIG. 3), a signal from a remote vehicle unit (e.g. the embodiment shown in FIG. 4), or a combination thereof.

In one embodiment, the first control system 9 continuously stores a log of calculated true RMS voltages for retrieval at a later time. In one embodiment, the first control system 9 stores a database of calculated true RMS voltages on an external flash media (e.g. SD card).

The First Display 37

The first display 37 displays at the local location the calculated true RMS voltage between the first electrode 1 and the second electrode 3. Preferably, the first display 37 is a cathode-ray-tube (CRT), led array, etc. . . . , more preferably a liquid crystal display (LCD).

The First Alarm 11

In the embodiment shown in FIG. 2, the first alarm 11 preferably produces a visual signal via a strobe light, LED, light bulb, etc. . . . . Preferably, the first alarm 11 is a strobe light or other device capable of producing a high-intensity light.

The Second Alarm 12

In the embodiment shown in FIG. 2, the second alarm 12 preferably produces an audible signal via a horn, speaker, bell, etc. . . . . Preferably, the second alarm 12 is a horn or bell capable of producing a loud sound.

FIG. 3

Figure 3:
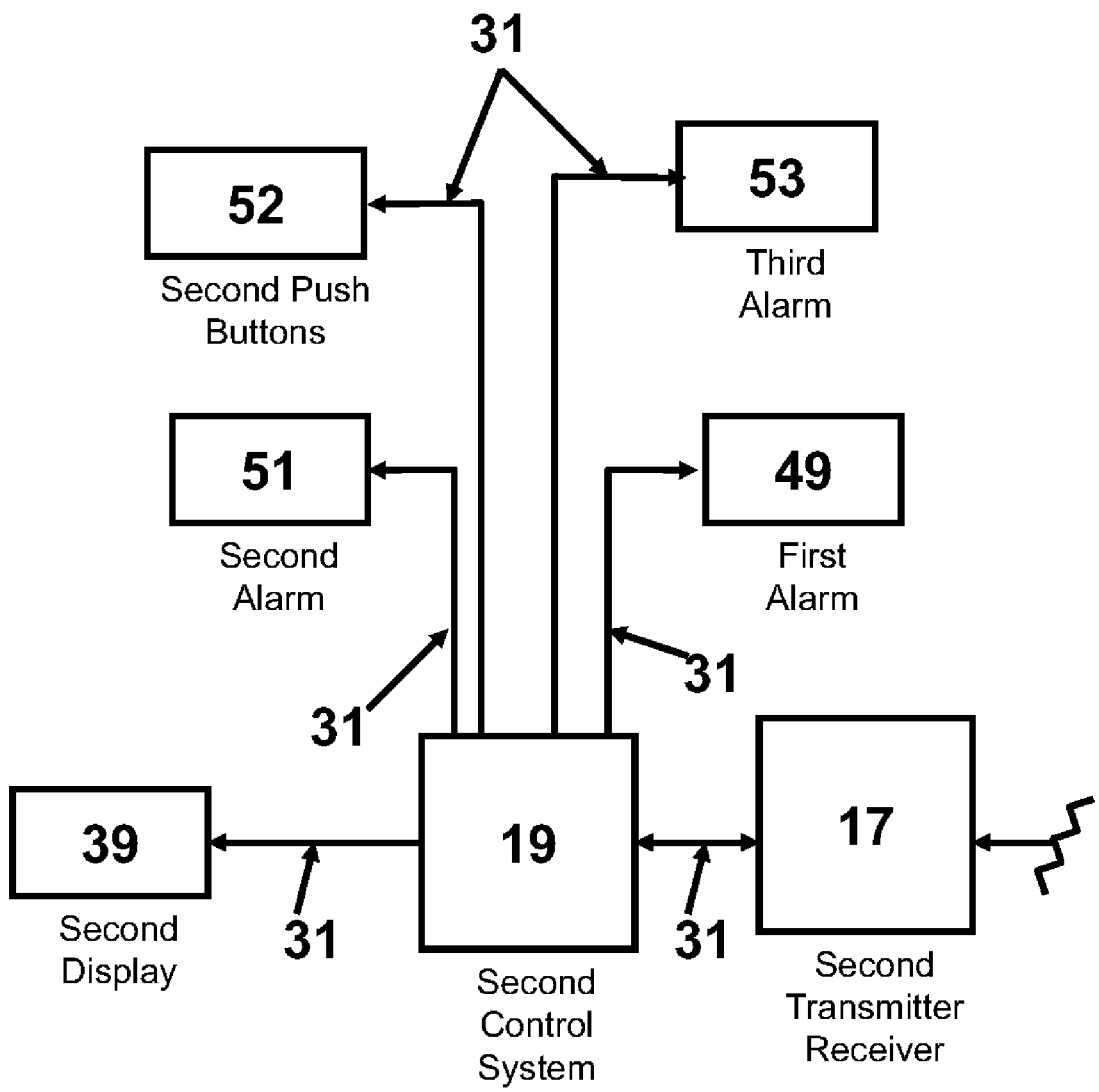
FIG. 3 depicts a preferred embodiment of a Ground Potential Rise (GPR) Monitor Handheld Unit using a true RMS voltage.

FIG. 3 depicts a preferred embodiment of a Ground Potential Rise (GPR) monitor handheld unit. The embodiment shown in FIG. 3 has a second transmitter/receiver 17, a second control system 19, a second display 39, a first alarm 49, a second alarm 51, a third alarm 53, and second push buttons 52. The second transmitter/receiver 17 is electromagnetically connected to the first transmitter/receiver 13 of FIG. 2. The second control system 19 is connected to the second transmitter/receiver 17, the second display 39, the first alarm 49, the second alarm 51, the third alarm 53, and the second push buttons 52, preferably by one or more wires 31.

The Second Display 39

The second display 39 displays the calculated true RMS voltage of the first electrode 1 and the second electrode 3 shown in FIG. 2. Preferably, the second display 39 is a cathode-ray-tube (CRT), led array, etc. . . . , more preferably a liquid crystal display (LCD).

The First Alarm 49

In the embodiment shown in FIG. 3, the first alarm 49 preferably produces a visual signal via a strobe light, LED, light bulb, etc. . . . . Preferably, the first alarm 49 is a strobe light or other device capable of producing a high-intensity light. In this embodiment, the GPR sensor of FIG. 2 will produce a first alarm enable signal at which time the first alarm 49 shown in FIG. 3 is enabled until the first alarm disable signal is transmitted from the GPR sensor of FIG. 2 and received by the GPR handheld unit of FIG. 3.

The Second Alarm 51

In the embodiment shown in FIG. 3, the second alarm 51 preferably produces an audible signal via a horn, speaker, bell, etc. . . . . Preferably, the second alarm 12 is a horn or bell capable of producing a loud sound. In this embodiment, the GPR sensor of FIG. 2 will produce a second alarm enable signal at which time the second alarm 51 shown in FIG. 3 is enabled until the second alarm disable signal is transmitted from the GPR sensor of FIG. 2 and received by the GPR handheld unit of FIG. 3.

The Third Alarm 53

In the embodiment shown in FIG. 3, the third alarm 53 preferably produces a mechanical signal, preferably a vibration by the use of a motor rotating a weight, an electromechanical hammer, or any other means of generating a vibration. Preferably, the third alarm 53 is a motor rotating an unbalanced weight.

The second control system 19 enables the third alarm 53 whenever the first alarm 49, the second alarm 51 or a combination there of is enabled. Once both the first alarm 49 and the second alarm 51 are disabled, second control system 19 disables the third alarm 53.

FIG. 4

Figure 4:
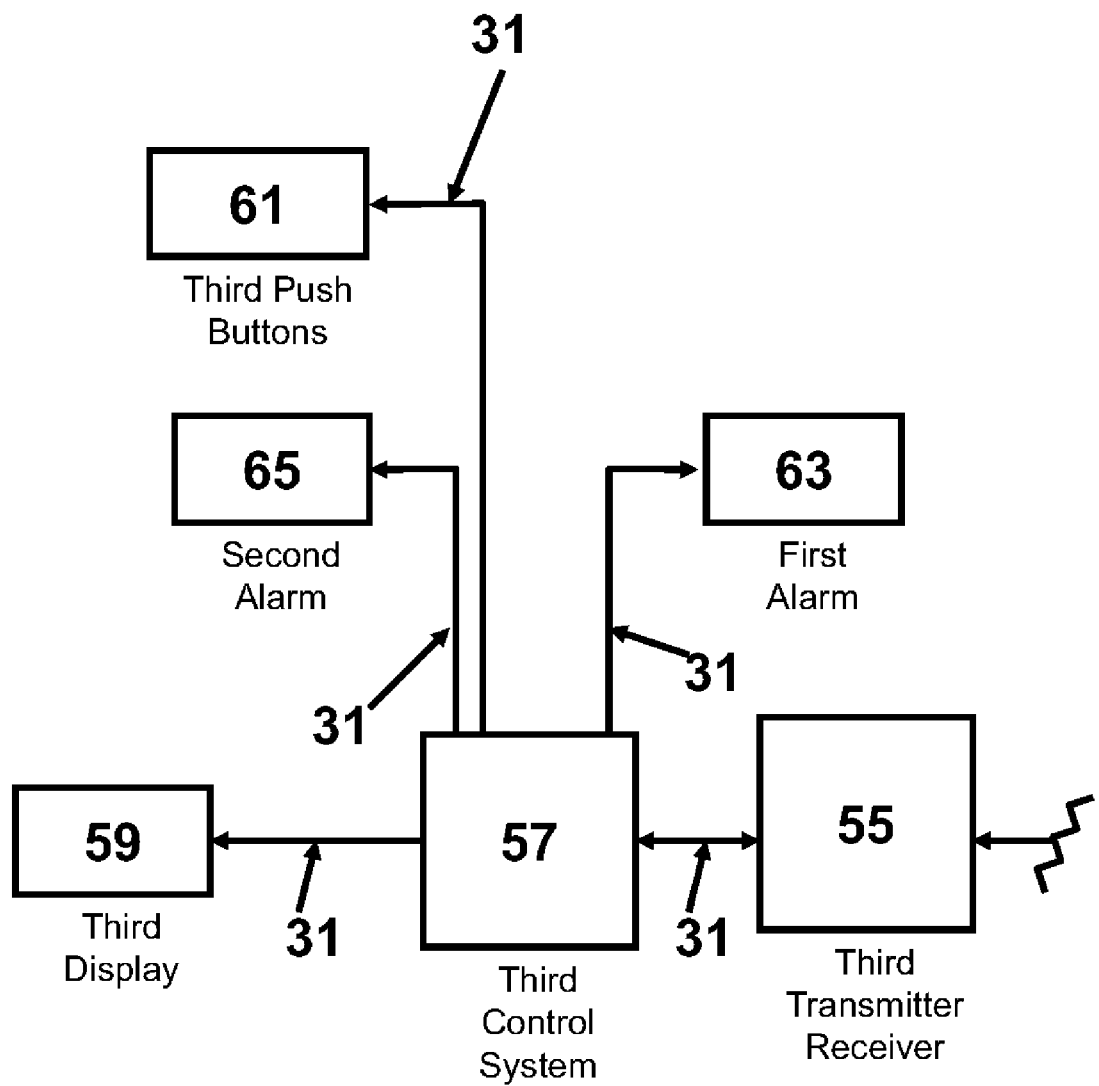
FIG. 4 depicts a preferred embodiment of a Ground Potential Rise (GPR) Monitor Vehicle Unit using a true RMS voltage.

FIG. 4 depicts a preferred embodiment of a Ground Potential Rise (GPR) Monitor Vehicle Unit. The embodiment shown in FIG. 4 has a third transmitter/receiver 55, a third control system 57, a third display 59, a first alarm 63, a second alarm 65, and third push buttons 61. The third transmitter/receiver 55 is electromagnetically connected to the first transmitter/receiver 13 of FIG. 2. The third control system 57 is connected to the third transmitter/receiver 55, the third display 59, the first alarm 63, the second alarm 65, and third push buttons 61, preferably by one or more wires 31.

The Third Display 59

The third display 59 displays the calculated true RMS voltage of the first electrode 1 and the second electrode 3 shown in FIG. 2. Preferably, the third display 59 is a cathode-ray-tube (CRT), led array, etc. . . . , more preferably a liquid crystal display (LCD).

The First Alarm 63

In the embodiment shown in FIG. 4, the first alarm 63 preferably produces a visual signal via a strobe light, LED, light bulb, etc. . . . . Preferably, the first alarm 63 is a strobe light or other device capable of producing a high-intensity light. Preferably, the first alarm 63 in this embodiment is powered by a vehicle battery. In one embodiment, the first alarm 63 is a strobe light on a vehicle or a vehicles fog lights or headlights. In this embodiment, the GPR sensor of FIG. 2 will produce a first alarm enable signal at which time the first alarm 63 shown in FIG. 4 is enabled until the first alarm disable signal is transmitted from the GPR sensor of FIG. 2 and received by the GPR vehicle unit of FIG. 4.

The Second Alarm 65

In the embodiment shown in FIG. 4, the second alarm 65 preferably produces an audible signal via a horn, speaker, bell, etc. . . . . Preferably, the second alarm 65 is a horn or bell capable of producing a loud sound. Preferably, the second alarm 65 in this embodiment is powered by a vehicle battery. In one embodiment, the second alarm 65 is a vehicle horn. In this embodiment, the GPR sensor of FIG. 2 will produce a second alarm enable signal at which time the second alarm 65 shown in FIG. 4 is enabled until the second alarm disable signal is transmitted from the GPR sensor of FIG. 2 and received by the GPR vehicle unit of FIG. 4.

FIG. 5

Figure 5:
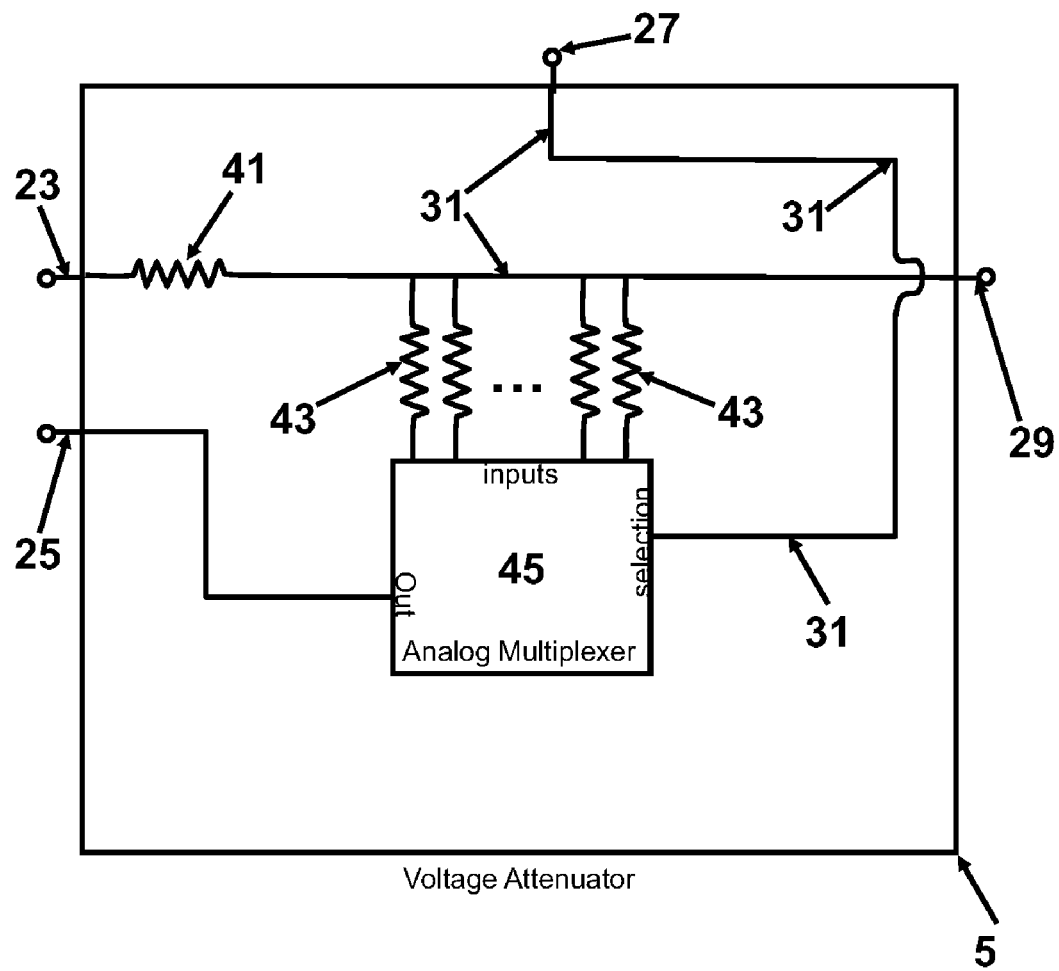
FIG. 5 depicts a preferred embodiment of a voltage attenuator using a true RMS voltage.

FIG. 5 depicts one embodiment of the voltage attenuator 5 in FIG. 1 and FIG. 2. In this embodiment, the voltage attenuator 5 comprises a first resistor 41, a plurality of selectable resistors 43, and an analog multiplexer 45.

The first resistor 41 has a first end and a second end. Likewise, each selectable resistor from the plurality of selectable resistors 43 has a first end and a second end. The analog multiplexer 45 has a plurality of inputs, an output and a selection port.

The first end of the first resistor 41 is the first input 23 of the voltage attenuator 5 (electrically connected to the first electrode 1 in FIG. 1 and FIG. 2). The second end of the first resistor 41 is electrically connected to the first end of each selectable resistor from the plurality of selectable resistors 43 and the output 29 of the voltage attenuator 5 (electrically connected to the input 33 of the true RMS detector 7 in FIG. 1 and FIG. 2). The second end of each selectable resistor from the plurality of selectable resistors 43 is electrically connected to a corresponding input from the plurality of inputs of the analog multiplexer 45. The output of the analog multiplexer 45 is the second input 25 of the voltage attenuator 5 (electrically connected to the second electrode 3 in FIG. 1 and FIG. 2). The selection port 27 of the voltage attenuator 5 is the selection port of the analog multiplexer 5 (electrically connected to the first control system 9 in FIG. 1 and FIG. 2).

In a preferred embodiment, the second electrode 3, connected to the output of the analog multiplexer 45, is also connected to the true RMS detector 7 (not shown for simplicity) in FIG. 1 and FIG. 2. This embodiment will be desirable when the second electrode 3 is not used as a common ground within the GPR Monitor Sensor. In an alternate embodiment, the second electrode 3 is a common relative ground connected to both the voltage attenuator 45 (through the second input 25) and the true RMS detector 7.

The First Resistor 41 and the Plurality of Selectable Resistors 43

The first resistor 41 and the plurality of selectable resistors 43 are resistors capable of handling the voltage and current it will likely be subjected to in the field. In a preferred embodiment, the first resistor 41 is a 10M ohm resistor and the plurality of selectable resistors 43 are 1K, 10.2K, 102K and 1.10M ohm resistors.

The Analog Multiplexer 45

The analog multiplexer 45 is an analog multiplexer capable of electrically connecting the second end of a selectable resistor from the plurality of selectable resistors 43 to the output of the analog multiplexer 45 (the second input 25 of the voltage attenuator 5 in FIG. 1 and FIG. 2). The analog multiplexer 45 also is capable of handling the voltage and current it will likely be subjected to in the field. In a preferred embodiment the multiplexer is a 74HC4052B.

FIG. 6

Figure 6:
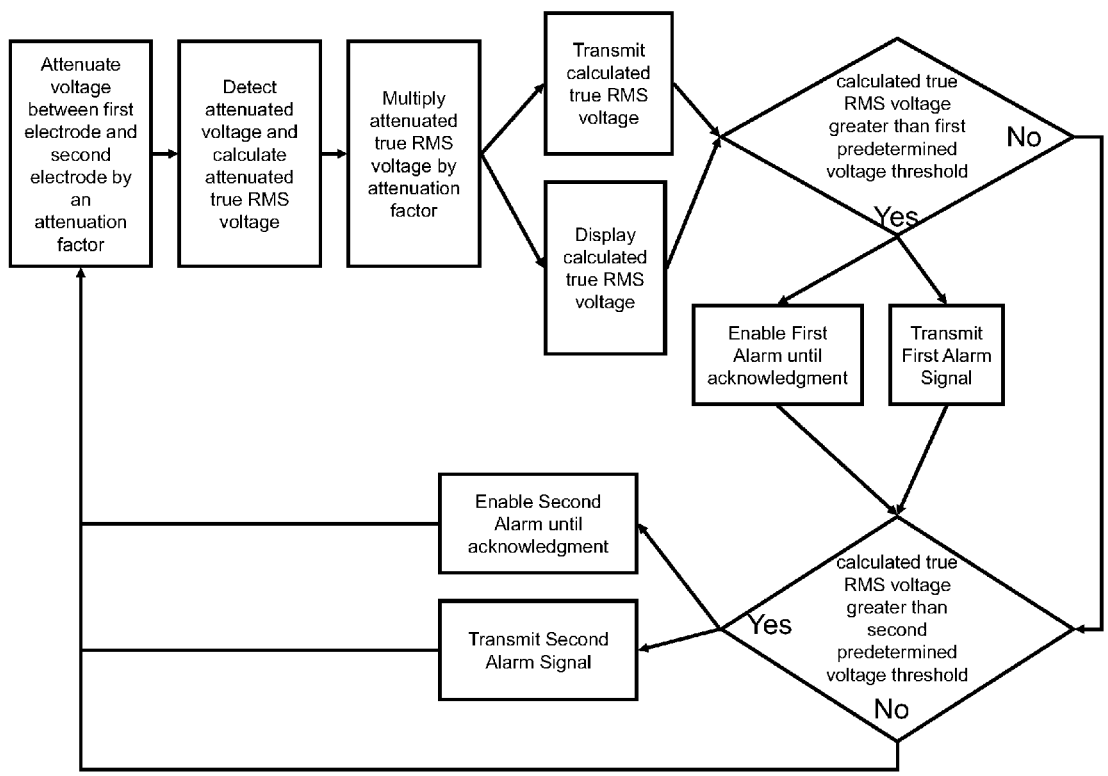
FIG. 6 depicts a flowchart of a preferred operation of a Ground Potential Rise (GPR) Monitor Sensor using a true RMS voltage.

FIG. 6 depicts a flowchart of a preferred operation of a GPR monitor sensor. As shown in FIG. 6, the GPR monitor attenuates the voltage between the first electrode and the second electrode. The attenuated voltage is then detected and the true RMS of the attenuated voltage is calculated to determine the attenuated true RMS voltage. Finally, the attenuated true RMS voltage is multiplied by the attenuation factor, which produces the calculated true RMS voltage. Preferably, the calculated true RMS voltage is then displayed at a local location as well as transmitted to remote units for display (e.g. the handheld unit in FIG. 3 or the vehicle unit in FIG. 4).

If the calculated true RMS voltage exceeds the first predetermined voltage threshold, the first alarm of the GPR monitor is enabled and preferably a first alarm signal is transmitted to the remote units. Therefore, the first alarm of the GPR monitor sensor and preferably any remote units will be enabled until acknowledged by a user.

Likewise, if the calculated true RMS voltage exceeds the second predetermined voltage threshold, the second alarm of the GPR monitor is enabled and preferably a second alarm signal is transmitted to the remote units. Therefore, the second alarm of the GPR monitor sensor and preferably any remote units will be enabled until acknowledged by a user.

FIG. 7

Figure 7:
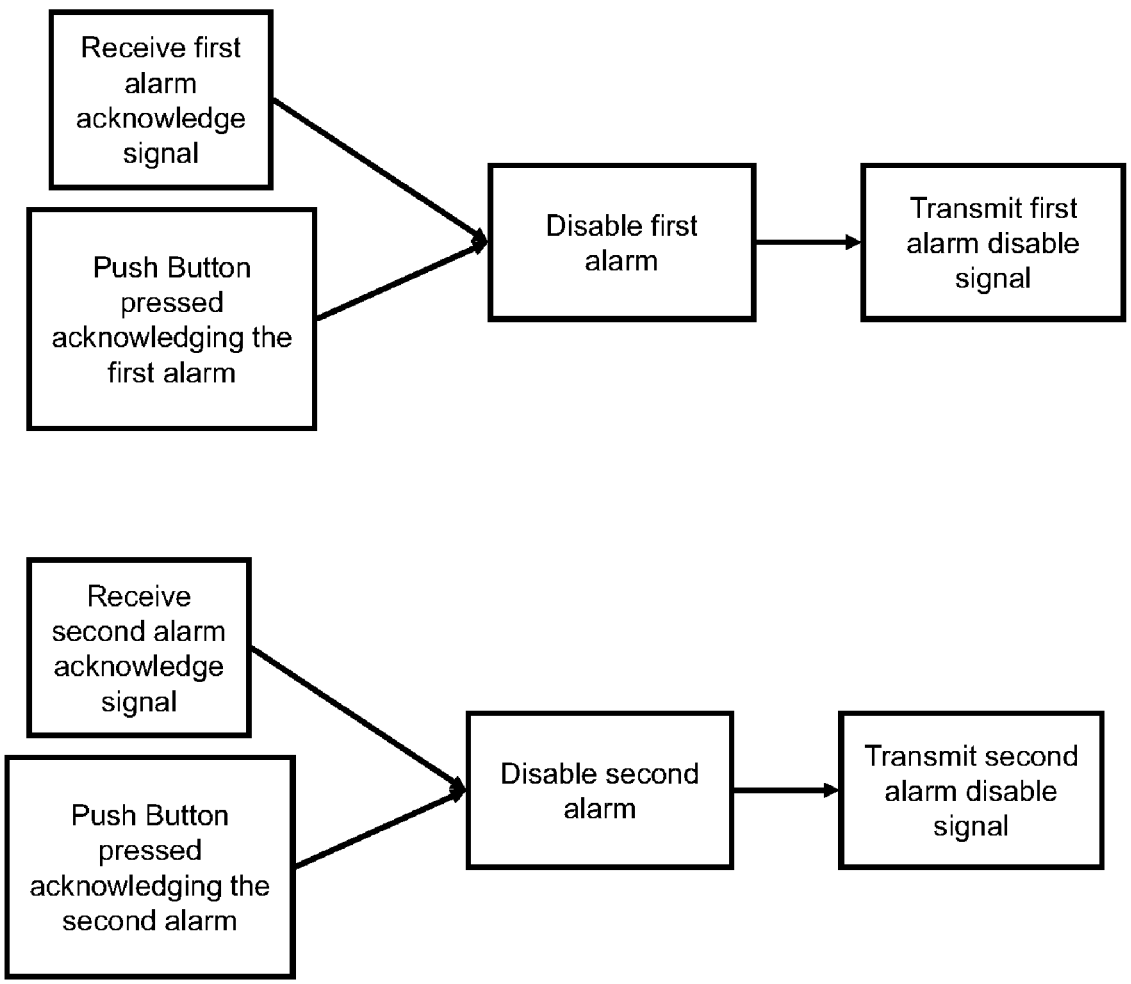
FIG. 7 depicts a flowchart of the events of a preferred operation of a Ground Potential Rise (GPR) Monitor Sensor using a true RMS voltage.

FIG. 7 depicts a flowchart of the events of a preferred operation of a GPR monitor sensor. As shown in FIG. 7, if the GPR monitor sensor either receives a first alarm acknowledge signal from a remote unit or a push button is pressed acknowledging the first alarm, the first alarm of the GPR monitor sensor is disabled and a first alarm disable signal is transmitted. Once disabled the first alarm is disabled, preferably until the sensor is reset by the user, disconnected from the first electrode and second electrode, a time period has elapsed, or the calculated true RMS voltage substantially changes.

Likewise, if the GPR monitor sensor either receives a second alarm acknowledge signal from a remote unit or a push button is pressed acknowledging the second alarm, the second alarm of the GPR monitor sensor is disabled and a second alarm disable signal is transmitted. Once disabled the second alarm is disabled, preferably until the sensor is reset by the user, disconnected from the second electrode and second electrode, a time period has elapsed, or the calculated true RMS voltage substantially changes.

The first alarm disable signal and the second alarm disable signal are any means of signaling to the remote units that the alarms should be disabled. In a preferred embodiment, the respective disabled signals are an electromagnetic signal transmitted causing the remote units to disabled the corresponding alarms. In the alternative, the respective alarm signals are continuously transmitted and the disable signal is simply a discontinuance of these enable signals. Preferably in this embodiment, the enable signal enables the corresponding alarm for a predetermined time period, preferably under a second) to account for any communication errors and communication bandwidth.

FIG. 8

Figure 8:
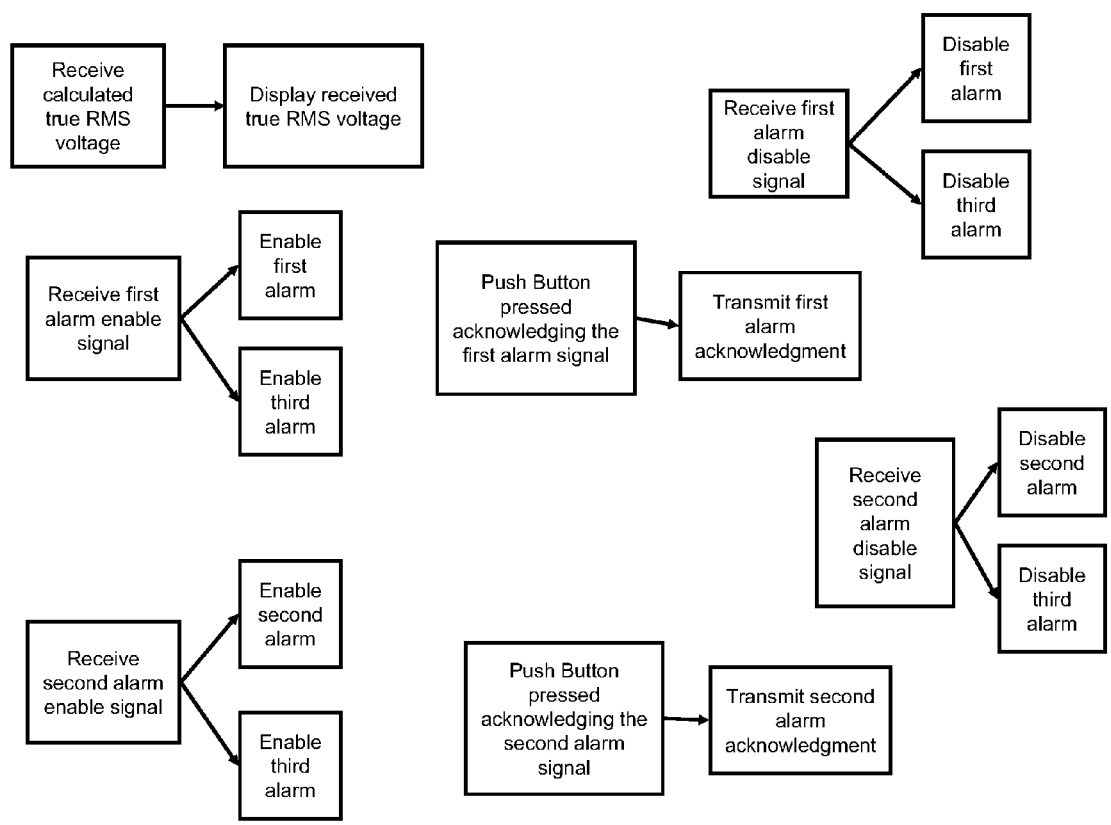
FIG. 8 depicts a flowchart of the events of a preferred operation of a Ground Potential Rise (GPR) Monitor Handheld Unit using a true RMS voltage.

FIG. 8 depicts a flowchart of the events of a preferred operation of a GPR monitor handheld unit (e.g. the embodiment show in FIG. 3). As shown in FIG. 8, the GPR monitor handheld unit preferably receives the calculated true RMS voltage from the GPR monitor sensor (e.g. the embodiment show in FIG. 2) and displays the received calculated true RMS voltage at the GPR monitor handheld unit.

If the GPR monitor handheld receives a first alarm enable signal, the first alarm of the GPR monitor handheld unit is enabled, as well as the third alarm. Thereafter, if the push buttons are pressed at the GPR monitor handheld unit acknowledging the first alarm a first alarm acknowledgement signal is transmitted to the GPR monitor sensor. If a first alarm disable signal is received, the first alarm and the third alarm are disabled.

If the GPR monitor handheld receives a second alarm enable signal, the second alarm of the GPR monitor handheld unit is enabled, as well as the third alarm. Thereafter, if the push buttons are pressed at the GPR monitor handheld unit acknowledging the second alarm a second alarm acknowledgement signal is transmitted to the GPR monitor sensor. If a second alarm disable signal is received, the second alarm and the third alarm are disabled.

FIG. 9

Figure 9:
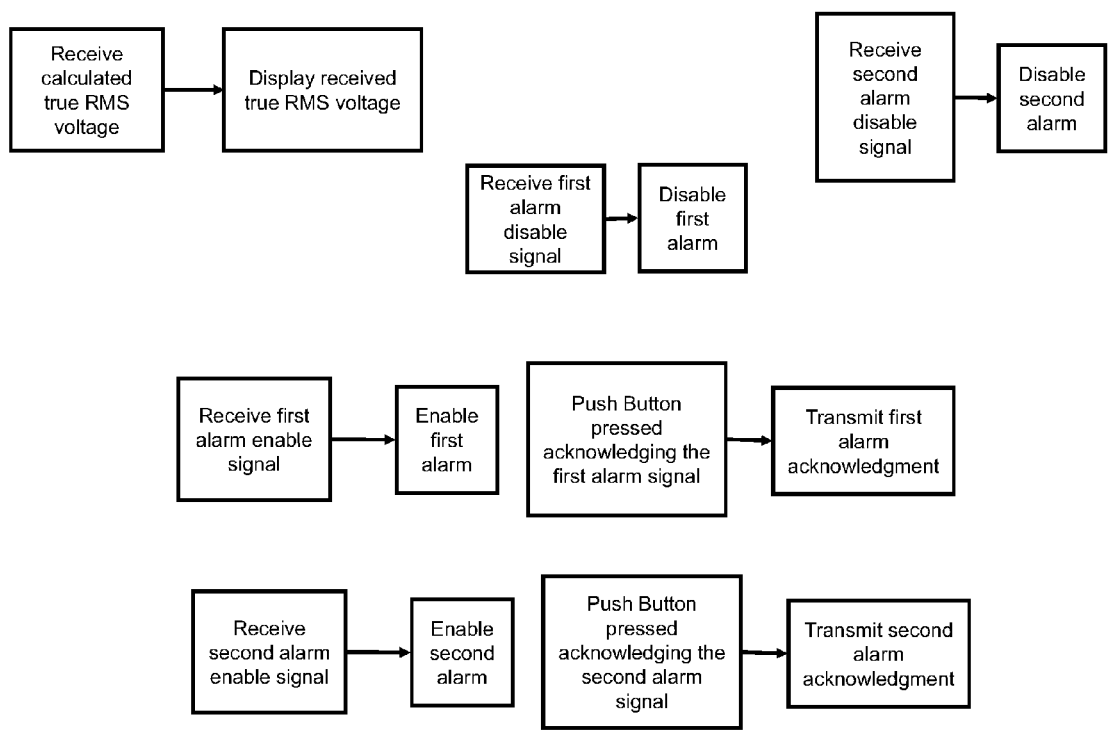
FIG. 9 depicts a flowchart of the events of a preferred operation of a Ground Potential Rise (GPR) Monitor Vehicle Unit using a true RMS voltage.

FIG. 9 depicts a flowchart of the events of a preferred operation of a GPR monitor vehicle unit (e.g. the embodiment show in FIG. 4). As shown in FIG. 9, the GPR monitor vehicle unit preferably receives the calculated true RMS voltage from the GPR monitor sensor (e.g. the embodiment show in FIG. 2) and displays the received calculated true RMS voltage at the GPR monitor vehicle unit.

If the GPR monitor vehicle unit receives a first alarm enable signal, the first alarm of the GPR monitor vehicle unit is enabled. Thereafter, if the push buttons are pressed at the GPR monitor vehicle unit acknowledging the first alarm a first alarm acknowledgement signal is transmitted to the GPR monitor sensor. If a first alarm disable signal is received, the first alarm is disabled.

If the GPR monitor vehicle unit receives a second alarm enable signal, the second alarm of the GPR monitor vehicle unit is enabled. Thereafter, if the push buttons are pressed at the GPR monitor vehicle unit acknowledging the second alarm a second alarm acknowledgement signal is transmitted to the GPR monitor sensor. If a second alarm disable signal is received, the second alarm is disabled.

FIG. 10

Figure 10:
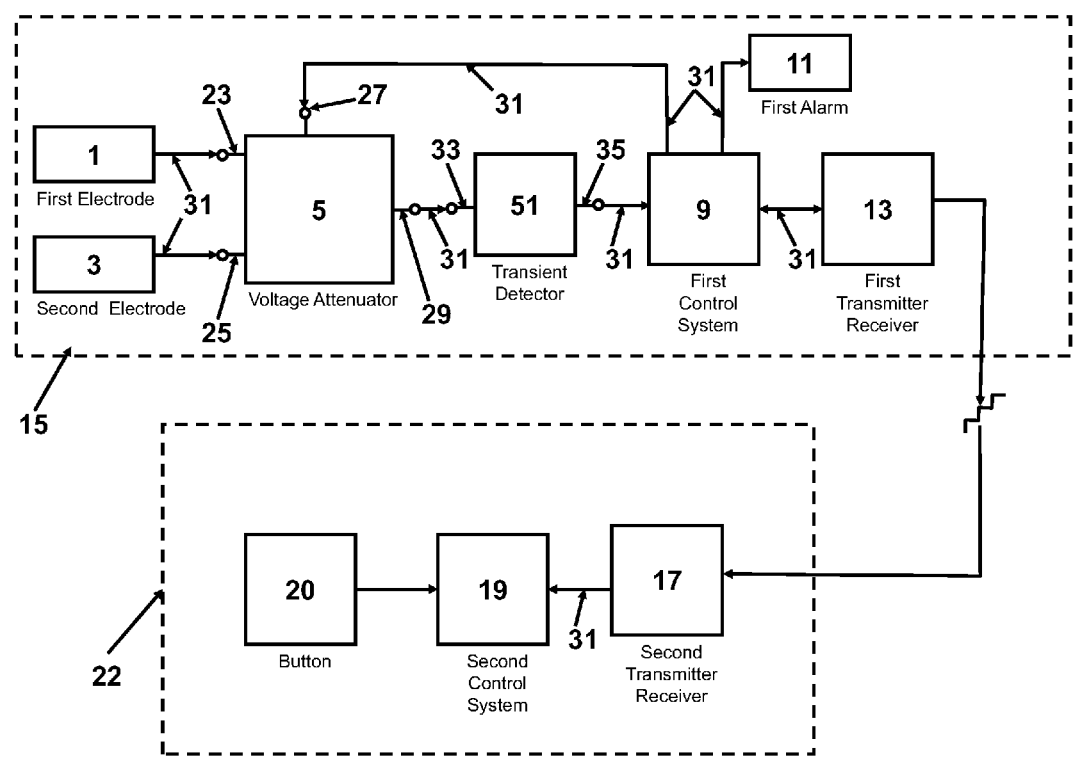
FIG. 10 depicts one embodiment of a Ground Potential Rise (GPR) Monitor System using a transient event energy detector.

FIG. 10 depicts one embodiment of a Ground Potential Rise (GPR) Monitor System using a transient event energy detector. FIG. 10 includes the first electrode 1, the second electrode 3, the voltage attenuator 5, the first control system 9, the first alarm 11, the first transmitter/receiver 13, the button 20, the second control system 19, the second transmitter/receiver 17, one or more wires 31, as described above. Instead of the true RMS detector 7, the embodiment shown in FIG. 10 includes a transient event energy detector 51. In this embodiment, the transient event energy detector 51 produces a signal to the first control system 9 indicative of the whether or not a transient event with energy greater than a first predetermined transient event energy threshold.

The first transmitter/receiver 13 is electromagnetically connected to the second transmitter/receiver 17. The second control system 19 is connected to the second transmitter/receiver 17 and the button 20 by one or more wires 31. It is preferred to include the first transmitter/receiver 13 and second transmitter/receiver 17, second control system 19, and button 20, as the remote location 22 provides as a safe place for workers to acknowledge the alarm. In the alternative, the first transmitter/receiver 13 and second transmitter/receiver 17, second control system 19, and button 20 may be omitted, preferably relying on other safety measures (e.g. electrically insulated boots, gloves, etc.).

Upon the detection of a transient event with energy greater than the first predetermined transient event energy threshold, the first control system 9 will enable the first alarm 11. In one embodiment, the first alarm 11 is only for notification of a transient event with energy greater than the first predetermined transient event energy threshold. In an alternate embodiment, the first alarm 11 is a generic alarm or serves other purposes other than notification of a transient event with energy greater than the first predetermined transient event energy threshold.

When the transient event with energy greater than the first predetermined transient event energy threshold, the first alarm 11 is enabled by the first control system 9 until a first alarm acknowledgment signal is transmitted by the second transmitter/receiver 17 and received by the first transmitter/receiver 13.

Preferably, the signal corresponding to the transient event energy is transmitted by the first transmitter/receiver 13 and received by the second transmitter and receiver 17, more preferably using a protocol such as defined in IEEE 802.15.4. In a preferred embodiment, the first transmitter/receiver 13 and the second transmitter/receiver 17 are both an Xbee® transmitter. Preferably, the transient event energy is then displayed to a user at the remote location 22.

Transient Detector 51

The transient detector 51 detects transient events across the first electrode 1 and the second electrode 3 having energy greater than the first predetermined transient event energy threshold. Preferably, transient events include, but are not limited to, transient events caused by energizing shunt reactors and shut capacitors. The detection and notification of these transient events will preferably put workers on notice of the dangerous conditions. Preferably, once notified, workers in the area will request that operations suspend all activities in the area that may result in possibly dangerous transients.

Preferably, the transient detector 51 detects a high-speed energy and a low-speed energy across the first electrode 1 and the second electrode 3 (preferably, after attenuation by the voltage attenuator 5). If the high-speed energy minus the low-speed energy matches or exceeds the predetermined transient threshold, the transient detector 51 sends a signal to the first control system 9 indicative of the detection of a transient.

The high-speed energy is preferably the voltage sampled at a sampling frequency that is high enough to detect the presence of transients. Preferably, the high-speed energy is sampled at a frequency greater than 1,000 Hz, more preferably greater that 2,000 Hz.

The low-speed energy is preferably the steady-state or average voltage across the first electrode 1 and the second electrode 3. In one embodiment, the low-speed energy is derived from the true RMS voltage. In a preferred embodiment, the low-speed energy is the voltage across the first electrode 1 and the second electrode 3 sampled at low-speed sampling rate. Preferably, the low-speed sampling frequency is less than 10 Hz, more preferably 6 Hz. In yet an alternate embodiment, the low-speed energy is the derived by passing a plurality of samples through one or more filters (preferably a low-pass filter). In one embodiment, the high-speed energy is sampled at a frequency greater than 1,000 Hz, more preferably greater that 2,000 Hz and the low-speed energy is derived from the high-speed samples passed through a low-pass filter.

The low-speed energy is computed by integrating the voltage detected squared divided by Rb, where Rb is the estimated human body resistance (preferably 1,000 Ohms). Likewise, the high-speed energy is computed by integrating the voltage detected squared divided by Rb, where Rb is the estimated human body resistance (preferably 1,000 Ohms).

In a preferred embodiment, the high-speed energy is calculated by sampling the voltage across the first electrode 1 and the second electrode 3 a frequency greater than 1,000 Hz, more preferably greater that 2,000 Hz. Preferably, a time window is selected, preferably about ¼ of a second. The following equation Eq. 1, or a related equation, is then used to calculate the high-speed energy $$\text{Energy}(J) = \frac{1}{Rb}\sum_{1}^{n} V(t)^2 dt \qquad \text{Eq. 1}$$

where Rb is the estimated human body resistance (e.g. 1,000 Ohms); n is the total number of samples measured in the time window (e.g. 500 samples for a ¼ second time window sampled at 2,000 Hz); V(T) is the measured voltage across the first electrode 1 and the second electrode 3; and dt (e.g. 0.5 ms if sampled at 2000 Hz) is the sample period, preferably and J is the energy in Joules.

Preferably, the low-speed energy is also calculated using Eq. 1, but using a much slower sampling rate, preferably less than 10 Hz, more preferably 6 Hz. In an alternate embodiment, the low-speed energy is estimated using the true RMS voltage, preferably using Eq. 2

$$\text{Low-Speed Energy}(J) = \frac{1}{Rb} V_{RMS}^2 \times t \qquad \text{Eq. 2}$$

where $V_{RMS}$ is the true RMS voltage and t is the time window used in the high-speed calculation, preferably about ¼ of a second.

Finally, the transient event energy is computed by subtracting the low-speed energy from the high-speed energy. Preferably, the first control system 9 signals an alarm if the transient event energy exceeds 13 Joules.

In an alternate embodiment, a value relating to the energy of the low-speed energy and the high-speed energy may be used to calculate a value relating to the energy of the transient and the transient threshold is properly set for the calculated value. For example, in one embodiment, the Rb constant may be omitted resulting in an energy computation related to the energy, but Rb times greater than the energy in Joules. In this embodiment, the transient threshold would be Rb times greater than the desired maximum Joule value.

FIG. 11

Figure 11:
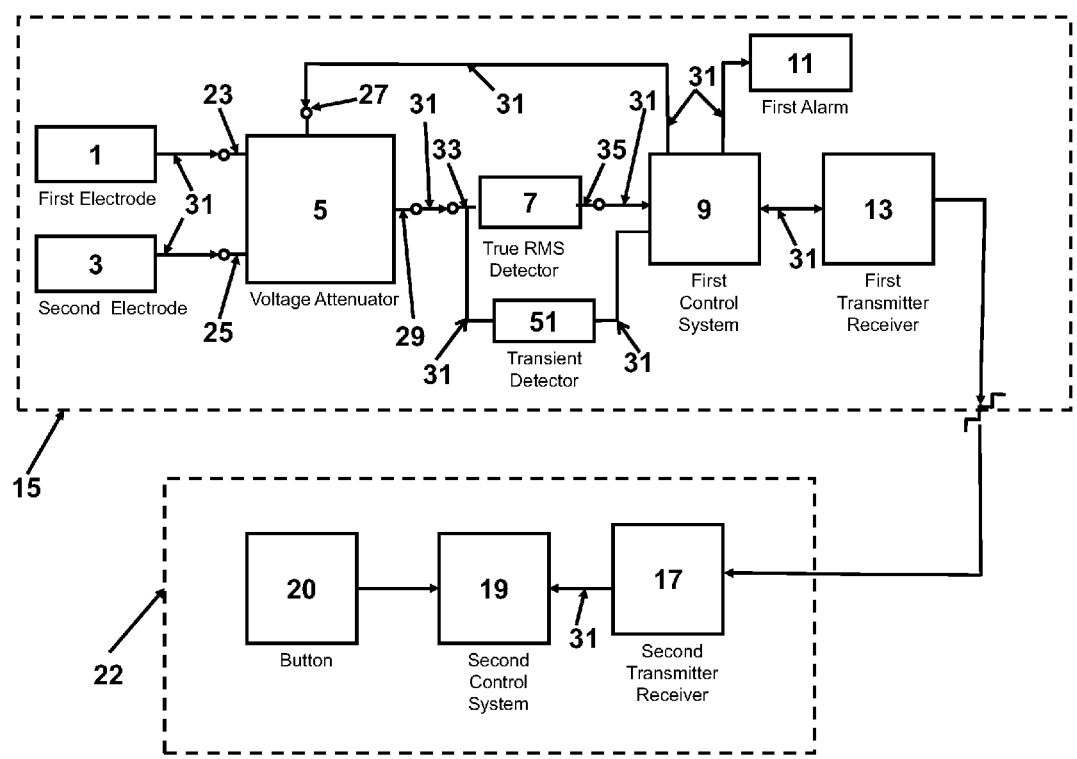
FIG. 11 depicts a preferred embodiment of a Ground Potential Rise (GPR) Monitor using a true RMS voltage and a transient event energy detector.

FIG. 11 depicts a preferred embodiment of a Ground Potential Rise (GPR) Monitor using a true RMS voltage and a transient detector. FIG. 11 includes the first electrode 1, the second electrode 3, the voltage attenuator 5, the transient detector 51, the first control system 9, the first alarm 11, the first transmitter/receiver 13, the button 20, the second control system 19, the second transmitter/receiver 17, one or more wires 31, as described above. It is preferred to include the first transmitter/receiver 13 and second transmitter/receiver 17, second control system 19, and button 20, as the remote location 22 provides as a safe place for workers to acknowledge the alarm. In the alternative, the first transmitter/receiver 13 and second transmitter/receiver 17, second control system 19, and button 20 may be omitted, preferably relying on other safety measures (e.g. electrically insulated boots, gloves, etc.).

FIG. 13, also includes the True RMS Detector 7, as described above, connected to the voltage attenuator 5 and the first control system 9. In this embodiment, the true RMS detector 7 and the transient detector 51 are both connected to the output 29 of the voltage attenuator 5. Preferably, the input of the true RMS detector 7 and the transient detector 51 are designed to avoid interfering with the output signal of the voltage attenuator 5. In a preferred embodiment, the true RMS detector 7 and the transient detector 51 both have a high-impedance input, or use a buffered operational amplifier to avoid attenuating the output signal of the voltage attenuator 5.

In one embodiment, the output of the true RMS detector 7 and the transient detector 51 are connected to the first control system 9 via a single input, preferably a bus or digital input, whereby the true RMS detector 7 and the transient detector 51 are both connected to a single input of the first control system 9. In an alternate embodiment, the output of the true RMS detector 7 and the transient detector 51 are each separately connected to different inputs of the first control system 9.

In a preferred embodiment, the true RMS detector 7 and the transient detector 51 are connected to the first control system 9 whereby the first control system 9 is capable of distinguishing a RMS voltage exceeding the first predetermined voltage detected by the true RMS detector 7 or a transient event energy exceeding the first predetermined transient event energy threshold detected by the transient detector 51. In this embodiment, the first alarm 11, is capable of sending distinctive alarms or additional alarms are added to provide distinctive alarms. For example, the first alarm 11 may enable a pulsating alarm in the event of the detection of a dangerous transient, and may enable a continuous alarm in the event of a dangerous RMS voltage detected.

FIG. 12

Figure 12:
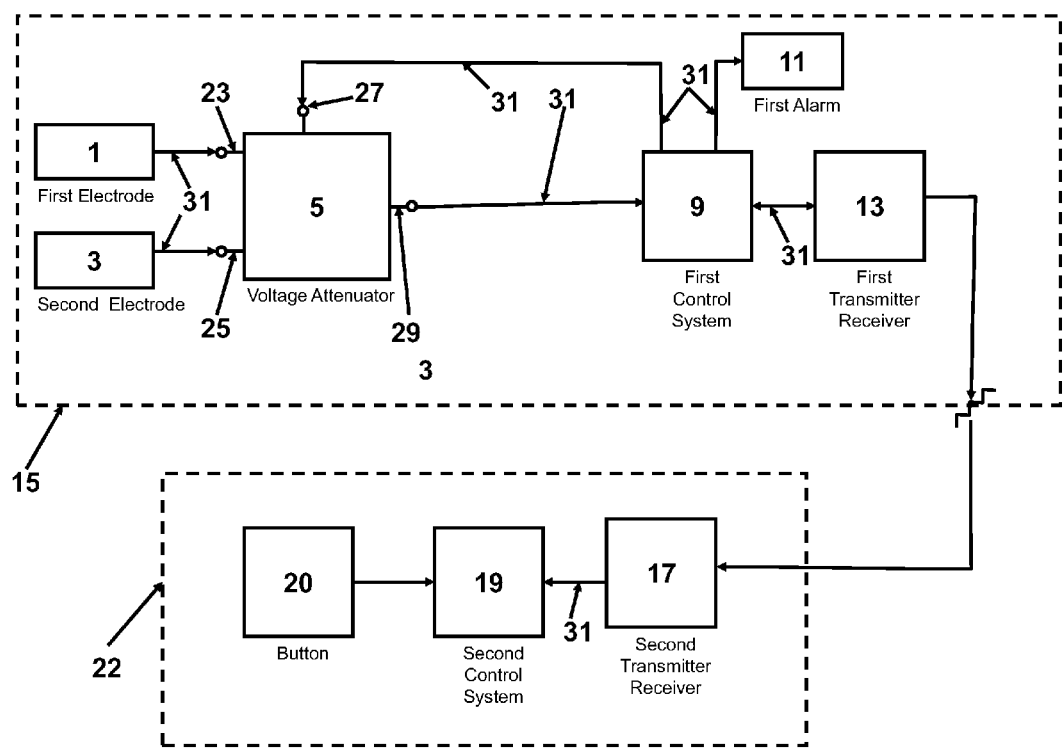
FIG. 12 depicts a preferred embodiment of a Ground Potential Rise (GPR) Monitor whereby the first control system provides the true RMS voltage and transient event energy detection.

FIG. 12 depicts a preferred embodiment of a Ground Potential Rise (GPR) Monitor whereby the first control system provides the true RMS voltage and transient event energy detection. In this embodiment, the first control system 9 provides the functionality of the true RMS detector 7, the transient event energy detector 51, or a combination thereof as described above. It is preferred to include the first transmitter/receiver 13 and second transmitter/receiver 17, second control system 19, and button 20, as the remote location 22 provides as a safe place for workers to acknowledge the alarm. In the alternative, the first transmitter/receiver 13 and second transmitter/receiver 17, second control system 19, and button 20 may be omitted, preferably relying on other safety measures (e.g. electrically insulated boots, gloves, etc.).

The Predetermined Thresholds

In one embodiment, the user directly inputs the values for the first predetermined voltage threshold, the second predetermined voltage threshold, the first predetermined transient event energy threshold or a combination thereof. In the alternative, the values for the first predetermined voltage threshold, the second predetermined voltage threshold, the first predetermined transient event energy threshold, or a combination thereof may be calculated from factors such as user exposure time and body resistance.

In one embodiment, the user is asked to input the resistance of the reference probe and a control system computes the soil resistivity based on the assumption of the reference probe diameter, preferably ⅝ inch, and it is driven into the soil at a depth, preferably 9 inches. Using the computed soil resistivity, a control system then computes the first predetermined voltage threshold, the second predetermined voltage threshold, or a combination thereof.

A more convenient option is for the soil resistivity to be determined by the sensor unit directly, for example by the Wenner Arrangement, utilizing four equally-spaced electrodes, the Three-Point Driven Rod Method, utilizing a driven ground rod and two smaller electrodes, or the Two-Point Driven Rod Method, utilizing two identical electrodes driven the same depth into the ground.

In yet another embodiment, the soil characteristics, more particularly, the soil resistivity is determined indirectly by connecting an electrical resistor across the first electrode and the second electrode. The electrical resistor is used to calculate the electrical current using its known resistance and determining the voltage across the resistor by applying ohms law. Preferably, the determined electrical current is used by a control system to enable an alarm when the current exceeds a predetermined current threshold. When an electrical current exceeds a predetermined electrical current threshold, a crowbar circuit is preferably used to electrically connect the first electrode and the second electrode without passing electrical through the ground potential rise monitor. Preferably, the crowbar circuit has a minimized electrical resistance. Preferably, when the calculated electrical current through the ground potential rise monitor exceeds a predetermined current limited, the crowbar circuit is enabled to handle the higher electrical current. Preferably, the crowbar circuit is designed to handle up to 20 amps of steady-state current. Preferably, the crowbar is periodically temporally disabled for a short time period in order to allow the ground potential monitor to take measurements, without damaging the ground potential rise monitor. Preferably, the crowbar circuit has a fuse and a means for detecting when the fuse is blown, for example optics, electrical conductivity testing, current detection etc.

It is to be understood that the above-described arrangements are only illustrative of the application of the principles of the present invention. Numerous modifications and alternative arrangements may be devised by those skilled in the art without departing from the spirit and scope of an electromagnetic wrap and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶ 6. In particular, the use of "step of" in the claims herein is not intended to invoke the provisions of 35 U.S.C. §112, ¶ 6.

The invention claimed is:

1. A device for the detection of ground potential rise comprising:
   a. a first electrode and a second electrode;
   b. a voltage attenuator comprising a first input, a second input, and an output;
   c. said first input of said voltage attenuator electrically connected to said first electrode;
   d. said second input of said voltage attenuator electrically connected to said second electrode;
   e. a means for determining the presence of a dangerous ground potential connected to said voltage attenuator;
   f. a means for enabling one or more alarms upon the detection of said dangerous ground potential; and
   g. said means for determining the presence of a dangerous ground potential and said means for enabling one or more alarms comprising one or more computers, microcontrollers, or application specific integrated circuits (ASIC);
   h. said means for determining the presence of a dangerous ground potential comprising:

i. a means for determining the true RMS voltage at said output of said voltage attenuator; and
i. said a means for enabling one or more alarms comprising:
  i. a means for enabling one or more alarms when said true RMS voltage exceeds a first predetermined voltage threshold;
j. a first control system comprising said means for determining the true RMS voltage and said means for enabling one or more alarms;
k. said first control system comprising one or more storage medias and an analog-to-digital converter;
l. said analog-to-digital converter electrically connected to said output of said voltage attenuator;
m. said one or more storage medias comprising computer code for performing one or more calculations to determine an RMS value based on the voltage at said output of said voltage attenuator;
n. said first control system comprising a first predetermined voltage relating to said first predetermined voltage threshold; and
o. said first control system comprising a storage media comprising computer code for comparing said determined RMS value and said first predetermined value.

2. A device for the detection of ground potential rise comprising:
a. a first electrode and a second electrode;
b. a voltage attenuator comprising a first input, a second input, and an output;
c. said first input of said voltage attenuator electrically connected to said first electrode;
d. said second input of said voltage attenuator electrically connected to said second electrode;
e. a means for determining the presence of a dangerous ground potential connected to said voltage attenuator;
f. a means for enabling one or more alarms upon the detection of said dangerous ground potential; and
g. said means for determining the presence of a dangerous ground potential and said means for enabling one or more alarms comprising one or more computers, microcontrollers, or application specific integrated circuits (ASIC);
h. said means for determining the presence of a dangerous ground potential comprising:
  i. a transient detector connected to said output of said voltage attenuator;
  ii. said transient detector having a means for sampling the voltage at the output of said voltage attenuator at a low-speed and at a high-speed;
  iii. said high-speed greater than said low-speed;
  iv. said high-speed equal to or greater than 1,000 Hz; and
i. said a means for enabling one or more alarms comprising:
  i. a means for enabling one or more alarms when the transient energy detected by said transient detector exceeds a first predetermined transient energy threshold.

3. The device for the detection of ground potential rise of claim 2 further comprising:
i. said high-speed equal to or greater than 2,000 Hz.

4. The device for the detection of ground potential rise of claim 2 further comprising:
i. said low-speed equal to or less than 10 Hz.

5. The device for the detection of ground potential rise of claim 2 further comprising:
i. said first predetermined transient threshold is greater than 13 Joules.

6. A device for the detection of ground potential rise comprising:
a. a first electrode and a second electrode;
b. a voltage attenuator comprising a first input, a second input, and an output;
c. said first input of said voltage attenuator electrically connected to said first electrode;
d. said second input of said voltage attenuator electrically connected to said second electrode;
e. a means for determining the presence of a dangerous ground potential connected to said voltage attenuator;
f. a means for enabling one or more alarms upon the detection of said dangerous ground potential; and
g. said means for determining the presence of a dangerous ground potential and said means for enabling one or more alarms comprising one or more computers, microcontrollers, or application specific integrated circuits (ASIC);
h. said means for determining the presence of a dangerous ground potential comprising:
  i. a means for determining the true RMS voltage at said output of said voltage attenuator; and
i. said a means for enabling one or more alarms comprising:
  i. a means for enabling one or more alarms when said true RMS voltage exceeds a first predetermined voltage threshold;
j. said means for determining the presence of a dangerous ground potential comprising:
  i. a transient detector connected to said output of said voltage attenuator;
  ii. said transient detector having a means for sampling the voltage at the output of said voltage attenuator at a low-speed and at a high-speed;
  iii. said high-speed greater than said low-speed;
  iv. said high-speed equal to or greater than 1,000 Hz; and
k. said a means for enabling one or more alarms comprising:
  i. a means for enabling one or more alarms when the transient energy detected by said transient detector exceeds a first predetermined transient energy threshold.

7. The device for the detection of ground potential rise of claim 6 further comprising:
a. a first transmitter/receiver connected to said means for enabling one or more alarms;
b. a second transmitter/receiver electromagnetically connected to said first transmitter/receiver; and
c. a button connected to said second transmitter/receiver.

8. The device for the detection of ground potential rise of claim 7 further comprising:
a. a first display connected to said first control system;
b. said first display displaying said determined true RMS voltage;
c. a second control system connected to said second transmitter/receiver;
d. a second display connected to said second control system; and
e. said second display displaying said determined true RMS voltage.

9. The device for the detection of ground potential rise of claim 8 further comprising:
a. said high-speed equal to or greater than 2,000 Hz;
b. said low-speed equal to or less than 10 Hz; and
c. said first predetermined transient threshold is greater than 13 Joules.

10. The device for the detection of ground potential rise of claim 9 further comprising:
   a. a first control system comprising said means for determining the true RMS voltage and said means for enabling one or more alarms;
   b. said first control system comprising one or more storage medias and an analog-to-digital converter;
   c. said analog-to-digital converter electrically connected to said output of said voltage attenuator;
   d. said one or more storage medias comprising computer code for performing one or more calculations to determine an RMS value based on the voltage at said output of said voltage attenuator;
   e. said first control system comprising a first predetermined voltage relating to said first predetermined voltage threshold; and
   f. said first control system comprising a storage media comprising computer code for comparing said determined RMS value and said first predetermined value.

11. The device for the detection of ground potential rise of claim 9 further comprising:
   a. said means for determining the true RMS voltage comprising a true RMS voltage detector electrically connected to said output of said voltage attenuator and said means for enabling one or more alarms.

* * * * *